Nov. 16, 1965 T. J. RAUB ET AL 3,218,462
DIRECT CURRENT AMPLIFIER
Filed Nov. 29, 1961
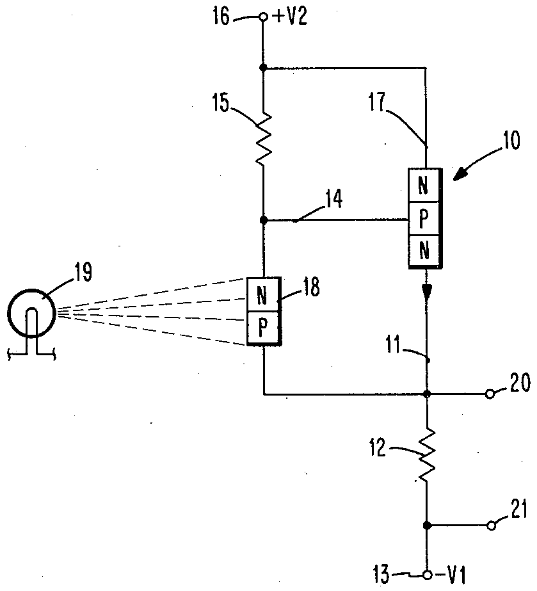
INVENTORS
THOMAS J. RAUB
JAMES E. TAUNT
BY K. P. Johnson
ATTORNEY United States Patent Office 3,218,462

Patented Nov. 16, 1965

3,218,462

DIRECT CURRENT AMPLIFIER

Thomas J. Raub, Endicott, N.Y., and James E. Taunt, Los Angeles, Calif., assignors to International Business Machines Corporation, New York, N.Y., a corporation of New York Filed Nov. 29, 1961, Ser. No. 155,670

3 Claims. (Cl. 250—212)

This invention relates generally to direct current amplifiers and more particularly to an amplifier circuit for a photo-responsive device.

Generally a semiconductive device is sensitive to radiant energy at its P-N junction, and for this reason such devices are frequently employed as control elements in an application where light is an easily changed form of radiant energy. If the intensity of light is varied at the P-N junction, the quantity of carriers emitted by the semiconductive device will also vary in the same manner. Thus, across the two terminals of a photovoltaic cell a small but definite voltage signal will be developed as an electrical current is generated due to an increased intensity of light. This signal is at best, however, only a few tenths of a volt and must be amplified to provide a practical control signal.

The amplification of such a small signal presents difficulty from the standpoint of reliability and economics. Conventional amplifiers, particularly semiconductor circuits, need multiple amplifying stages that have to be carefully shielded to prevent noise signals that would overshadow the signal produced by the photo-responsive device. Because of this, there exists a lack of reliability in such amplifiers. However, when an attempt is made to improve the reliability by providing a more sophisticated amplifier, the circuit cost is also increased.

It is, accordingly, an object of this invention to provide an improved amplifying circuit for the signals of photo-responsive devices.

Another object of this invention is to provide a direct current amplifier of simple and inexpensive design which is especially adapted to the amplification of small input signals.

Another object of this invention is to provide an amplifiers circuit for small signals which employs the inherent stability of a transistor emitter follower circuit to improve amplifier reliability.

Yet another object of this invention is to provide an amplifier circuit employing an emitter follower as a voltage gain device for a photo-responsive semiconductive device.

The foregoing and other objects of the invention are accomplished by connecting a photo-responsive device between the base and emitter of a transistor emitter follower. The device is connected so as to be reversely biased and in this manner the output signal of the device is constantly reference to the emitter potential of the emitter follower. With this configuration the entire output of the photo-responsive device, when exposed to a source of light, will reversely bias the transistor base with respect to the emitter and quickly reduce transistor conduction, driving it toward cut-off by regenerative feedback or "bootstrap" action. When the light is removed from the device, normal emitter follower action will rapidly resume in the then forward biased transistor by the same effect.

Because of the voltage amplification thus produced in an emitter follower, the output signal of the circuit is of sufficient amplitude as a control signal for a succeeding circuit so that multiple amplification stages may be omitted. This amplifier circuit has the additional advantage of utilizing other characteristics of an emitter follower for the resulting output signal.

The foregoing and other objects, features and advantages of the invention will be apparent from the following and more particular description of a preferred embodiment of the invention, as illustrated in the accompanying drawing.

Referring now to the single figure, there is shown an NPN transistor 10 having its emitter electrode 11 connected through an emitter resistor 12 to a supply terminal 13 which is connected, in turn, to a suitable source of negative potential V1. Base electrode 14 is connected through a current limiting base resistor 15 to terminal 16 which is, in turn, coupled with a source of positive potential V2. Collector electrode 17 is directly connected to terminal 16 and the source of positive potential.

A photovoltaic cell 18, illustrated as comprising a junction of N and P type semiconductor materials, is connected in a reversely biased direction between base electrode 14 and emitter electrode 11 of transistor 10. The cell is so oriented as to have its N-P junction exposed to light from a source 19 which may be varied in intensity from darkness to maximum brightness, or from which light can be blocked by any shutter-like device. The output signal from the circuit may be taken across the emitter resistor 12 at terminals 20 and 21.

The operation of the circuit will now be described under two operating conditions, that of no light at the P-N junction of cell 18 and that of maximum light at the junction. When no light from source 19 reaches the junction of cell 18, the cell presents a high impedance to current flow along the path from terminal 16, at a positive potential, through base resistor 15, cell 18, and emitter resistor 12 to terminal 13, at a negative potential. Under the no light condition, no current flows through cell 18 except slight leakage current which is in the order of a few microamperes. However, a parallel current path is present under this condition which is from terminal 16 to collector electrode 17 through transistor 10, emitter electrode 11, and through emitter resistor 12 to terminal 13. The base current necessary for the conduction of transistor 10 is supplied through resistor 15 and base electrode 14, so that under a no-light condition transistor 10 is in a state of maximum conduction limited only by the base current supplied through resistor 15. Under this condition maximum current flow exists through resistor 12 which, in turn, provides the maximum up-level signal across terminals 20 and 21. Thus, when base resistor 15 is chosen to supply sufficient base current to the transistor so that the transistor operates near the saturation region, nearly the entire difference in potential between terminals 13 and 16 will appear as an output signal at terminals 20 and 21 across resistor 12.

When maximum light, or that light necessary to maintain the cell at its maximum current generating capacity, is transmitted to the junction of cell 18, current is generated within the cell and a voltage is produced across the cell. This voltage biases base electrode 14 negative with respect to emitter electrode 11, driving transistor 10 toward cut-off. The light at the junction of cell 18 also reduces the cell's internal impedance permitting increased current to flow from base 14 to emitter 11 through the cell. The impedance is sufficiently lowered so that now current through resistor 15 by-passes the transistor base further reducing transistor conduction.

Therefore, due to the negative bias across the transistor base-emitter and the decreasing base current, the voltage level at terminal 20 drops, carrying emitter 11 toward the potential at terminal 13. During this action the voltage across cell 18 remains as a negative bias for transistor 10, and the increasing potential difference between terminal 16 and resistor 12 draws still more current away from base electrode 14. The result is that transistor 10 is quickly urged toward cut-off because of positive or regenerative feedback to base 14 from emitter 11 as the emitter voltage level decreases.

When maximum current flow through cell 18 is sufficient to accommodate substantially all of the current available through resistor 15 and the collector-base leakage current of transistor 10, the transistor will be cut off. At this time the current through emitter resistor 12 is that through the cell, which is in the order of 100 to 200 microamperes. The voltage level at output terminal 20, therefore, can closely approach the potential at terminal 13.

It is thus seen that this arrangement takes advantage of both transistor base-collector current amplification and the referencing of a base control signal to the emitter in order to obtain significant voltage amplification. By reducing the current available to base electrode 14 and reversely biasing the transitor base relative to the emitter through the use of a photovoltaic cell, a fast-operating "bootstrap" response is achieved.

Whenever cell 18 is exposed to a quantity of light, the entire signal produced across the cell appears as a constant control signal to hold base electrode 14 negative relative to emitter electrode 11. With the cell exposed to some intermediate quantity of light, the conduction of transisor 10 will be reduced until the current capacity of the cell is reached which corresponds with the radiant energy falling thereon. This causes the output signal level at terminal 20 to also be reduced in accordance with the base-collector current gain characteristic for the particular transistor used. Output terminals 20 and 21 are preferably connected to a high impedance input having a limited current demand so that the voltage amplification of the emitter follower is maintained at a maximum.

From the foregoing description it is evident that the resistors 12 and 15 are selected in accordance with the known current generating characteristics of cell 18 and the base-collector current amplification of transistor 10. A specific example of circuit components and voltages that may be used are as follows:

| | |
|---|---|
| V1 | —6 volts. |
| V2 | +6 volts. |
| Transistor **10** | Sylvania type 2N1308. |
| Photovoltaic cell **18** | Hoffman type EA7E3. |
| Resistor **12** | 3,000 ohms. |
| Resistor **15** | 80,000 ohms. |

Although the circuit of the invention has been described as employing an NPN type transistor, a PNP type may likewise be used. In this instance, cell 18 is connected in a reverse manner between the P-type emitter and N-type base to achieve reverse bias of the cell.

While the invention has been particularly shown and described with reference to a preferred embodiment thereof, it will be understood by those skilled in the art that the foregoing and other changes in form and details may be made therein without departing from the spirit and scope of the invention.

What is claimed is:

1. A circuit for amplifying the electrical signal produced by a photo-responsive semiconductor element in response to light falling thereon from a source, the combination comprising:

a voltage supply having first and second terminals of opposite polarity;

an output terminal;

a transistor having an emitter electrode, a base electrode and a collector electrode with said emitter electrode connected to said output terminal and said collector electrode connected to said first supply terminal;

a first resistor connected between said first terminal and said base electrode;

a second resistor connected between the junction of said emitter electrode and output terminal and said second supply terminal; and a photo-responsive semiconductor element connected between said base electrode and said emitter electrode for supplying a variable electrical signal between said base and emitter electrode in response to the quantity of light falling on said element, whereby the signal between said output terminal and said second supply terminal is an amplification of said variable signal.

2. An amplifier circuit comprising, in combination:

first and second supply terminals adapted to be connected to electrical potentials of opposite polarity;

an output terminal;

a transistor having a base electrode, an emitter electrode, and a collector electrode with said collector electrode being connected to said first supply terminal and said emitter being connected to said output terminal;

a first resistor connected between said first terminal and said base electrode;

a second resistor connected between said emitter electrode and said second terminal; and a photovoltaic cell connected between said base electrode and said emitter electrode so as to be reversely biased, for supplying a varying input signal between said base and said emitter electrodes in response to the quantity of light falling thereon, whereby the electrical signal in said output terminal is an amplification of said input signal.

3. The circuit as described in claim 2 wherein said photovoltaic cell is a P-N junction semiconductor element.

References Cited by the Examiner

UNITED STATES PATENTS

| | | | |
|---|---|---|---|
| 2,901,669 | 8/1959 | Coleman | 250—212 X |
| 2,944,165 | 7/1960 | Stuetzer | 250—211 |
| 3,061,724 | 10/1962 | Reich | 307—88.5 |

RALPH G. NILSON, *Primary Examiner.*

WALTER STOLWEIN, *Examiner.*